United States Patent
Amano (10) Patent No.: US 10,446,705 B2
(45) Date of Patent: Oct. 15, 2019

(54) TWO-DIMENSIONAL LAYERED MATERIAL QUANTUM WELL JUNCTION DEVICES

(71) Applicant: Konica Minolta Laboratory U.S.A., Inc., San Mateo, CA (US)

(72) Inventor: Jun Amano, Hillsborough, CA (US)

(73) Assignee: Konica Minolta Laboratory U.S.A., Inc., San Mateo, CA (US)

( * ) Notice: Subject to any disclaimer, the term of this patent is extended or adjusted under 35 U.S.C. 154(b) by 0 days.

(21) Appl. No.: 15/507,621

(22) PCT Filed: Jul. 30, 2015

(86) PCT No.: PCT/US2015/042913
§ 371 (c)(1),
(2) Date: Feb. 28, 2017

(87) PCT Pub. No.: WO2016/032680
PCT Pub. Date: Mar. 3, 2016

(65) Prior Publication Data
US 2017/0309762 A1    Oct. 26, 2017

Related U.S. Application Data

(60) Provisional application No. 62/043,196, filed on Aug. 28, 2014.

(51) Int. Cl.
*H01L 31/0352* (2006.01)
*H01L 31/18* (2006.01)
(Continued)

(52) U.S. Cl.
CPC ...... *H01L 31/035236* (2013.01); *B82Y 10/00* (2013.01); *B82Y 20/00* (2013.01);
(Continued)

(58) Field of Classification Search
CPC .......... H01L 31/0272; H01L 31/02725; H01L 31/035209; H01L 31/035218;
(Continued)

(56) References Cited

U.S. PATENT DOCUMENTS

| | | | | |
|---|---|---|---|---|
| 5,228,044 A * | 7/1993 | Ohba | ...... | B82Y 20/00 257/E33.048 |
| 6,597,011 B1 * | 7/2003 | Atanackovic | ...... | B82Y 20/00 257/12 |

(Continued)

FOREIGN PATENT DOCUMENTS

| JP | H04-156518 A | 5/1992 |
|---|---|---|
| JP | H07-325329 A | 12/1995 |

(Continued)

OTHER PUBLICATIONS

Fang et al., Quantum of optical absorption in two-dimensional semiconductors, 2013, Proceedings of National Academy of Sciences of the United States of Annerica, vol. 110, No. 29, pp. 11688-11691. (Year: 2013).*

(Continued)

*Primary Examiner* — Natalia A Gondarenko
(74) *Attorney, Agent, or Firm* — Osha Liang LLP (57) ABSTRACT

A quantum well device includes a first layer of a first two-dimensional material, a second layer of a second two-dimensional material, and a third layer of a third two-dimensional material disposed between the first layer and second layer. The first layer, the second layer, and the third layer are adhered predominantly by van der Waals force.

6 Claims, 9 Drawing Sheets

(51) Int. Cl.

| | |
|---|---|
| *H01L 31/0224* | (2006.01) |
| *H01L 29/24* | (2006.01) |
| *H01L 21/02* | (2006.01) |
| *H01L 29/267* | (2006.01) |
| *H01L 29/12* | (2006.01) |
| *H01L 29/861* | (2006.01) |
| *B82Y 10/00* | (2011.01) |
| *B82Y 20/00* | (2011.01) |
| *B82Y 30/00* | (2011.01) |
| *H01L 31/0304* | (2006.01) |
| *H01L 31/032* | (2006.01) |
| *H01L 33/06* | (2010.01) |
| *H01L 33/26* | (2010.01) |
| *H01L 29/20* | (2006.01) |

(52) U.S. Cl.
CPC ........ *B82Y 30/00* (2013.01); *H01L 21/02485* (2013.01); *H01L 21/02499* (2013.01); *H01L 21/02502* (2013.01); *H01L 21/02521* (2013.01); *H01L 21/02568* (2013.01); *H01L 29/122* (2013.01); *H01L 29/24* (2013.01); *H01L 29/267* (2013.01); *H01L 29/861* (2013.01); *H01L 31/0324* (2013.01); *H01L 31/03044* (2013.01); *H01L 31/035209* (2013.01); *H01L 31/18* (2013.01); *H01L 33/06* (2013.01); *H01L 33/26* (2013.01); *H01L 29/2003* (2013.01); *Y02E 10/544* (2013.01)

(58) Field of Classification Search
CPC ..... H01L 31/035272; H01L 31/035236; H01L 31/117; H01L 31/118; H01L 31/14; H01L 31/125; H01L 31/18; H01L 2924/055; H01L 2924/0566; H01L 2924/12041; H01L 2924/12042; H01L 2924/12043; H01L 2924/13088; H01L 2924/15792; H01L 29/122; H01L 29/1606; H01L 29/66015; H01L 29/66469; H01L 29/66439; H01L 29/66977; H01L 29/03; H01L 29/7782; H01L 33/04; H01L 49/006; H01L 51/5296; H01L 51/0046; H01L 31/0336; H01L 29/06; H01L 29/803; H01L 29/152; H01L 29/267; H01L 29/775; H01L 27/148; H01L 33/06; H01L 33/26; H01L 31/0324; H01L 31/03044; H01L 29/861; H01L 29/24; H01L 29/2003; H01L 21/02568; H01L 21/02521; H01L 21/02502; H01L 21/02499; H01L 21/02485; H01J 2237/2445; H01J 2237/2441; H01S 5/34; H01S 5/309; H01S 5/2228; H01S 5/3418; H05B 33/145; H05B 33/20; H05B 33/26; B82Y 30/00; B82Y 20/00; B82Y 10/00; Y02E 10/544

USPC ....... 257/12, 14, 15, 21, 22, 9, 24, E27.159, 257/E31.005; 438/92, 94, 458, 478, 408
See application file for complete search history.

(56) References Cited

U.S. PATENT DOCUMENTS

| | | |
|---|---|---|
| 9,806,164 B1* | 10/2017 | Terrones ................. H01L 29/45 |
| 2005/0077539 A1 | 4/2005 | Lipson |
| 2007/0158789 A1 | 7/2007 | Faris |
| 2009/0028487 A1* | 1/2009 | Fattal ..................... B82Y 20/00 385/2 |
| 2012/0141799 A1 | 6/2012 | Kub et al. |
| 2013/0207088 A1 | 8/2013 | Seo |
| 2014/0008616 A1 | 1/2014 | Geim et al. |
| 2014/0220764 A1 | 8/2014 | Bayram et al. |
| 2014/0231750 A1* | 8/2014 | Ravikumar ....... H01L 31/02966 257/21 |
| 2015/0083206 A1* | 3/2015 | Novoselov ............ B82Y 30/00 136/256 |
| 2015/0108431 A1* | 4/2015 | Kim ..................... H01L 31/032 257/21 |
| 2016/0020280 A1* | 1/2016 | Heo ........................ H01L 33/26 257/27 |
| 2017/0012117 A1* | 1/2017 | Radosavljevic .... H01L 29/7782 |

FOREIGN PATENT DOCUMENTS

| | | | |
|---|---|---|---|
| WO | 2013/140181 A1 | 9/2013 | |
| WO | WO 2013140181 A1 * | 9/2013 | ............ B82Y 30/00 |

OTHER PUBLICATIONS

Britnell et al., "Strong Light-Matter Interactions in Heterostructures of Atomically Thin Films", 2013, Science 340, pp. 1311-1314. (Year: 2013).*

Withers et al., "Light emitting diodes by band-structure engineering in van der Waals heterostructures", 2015, Nature Materials, vol. 14, pp. 301-306. (Year: 2015).*

Yu et al.,Highly efficient gate-tunable photocurrent generation in vertical heterostructures of layered materials, 2013, Nature Nanotechnology, vol. 8, pp. 952-958. (Year: 2013).*

International Search Report issued in corresponding application No. PCT/US2015/042913 dated Dec. 29, 2015 (1 page).

Written Opinion of the International Searching Authority issued in corresponding application No. PCT/US2015/042913 dated Dec. 29, 2015 (8 pages).

International Preliminary Report on Patentability and Written Opinion issued in corresponding International Application No. PCT/US2015/042913 dated Mar. 9, 2017 (10 pages).

Extended European Search Report in counterpart European Application No. 15836954.6 dated Mar. 28, 2018 (11 pages).

Office Action in counterpart Japanese Patent Application No. 2017-511609 dated Aug. 28, 2018 (9 pages).

* cited by examiner

TWO-DIMENSIONAL LAYERED MATERIAL QUANTUM WELL JUNCTION DEVICES

BACKGROUND

In general, a quantum well is a type of heterostructure formed by joining together layers of different semiconductor materials having different bandgaps. For example, a quantum well may be formed by sandwiching a gallium arsenide layer between two aluminum arsenide layers, the gallium arsenide layer being the well layer. The interface that occurs between the different layers may be referred to as a junction. In quantum well junctions, charge carriers are confined in the well and energy levels are quantized.

Quantum well structures have a variety of practical applications. For example, quantum well structures may be used to improve performance in various electronic devices, optical devices, or optoelectronic devices, including but not limited to laser diodes, photodetectors, and ballistic transport transistors.

Various known techniques exist to grow or manufacture quantum well structures. Precise control of layer thickness and defect-free interfaces may be important to tune the characteristics of the structure.

SUMMARY OF THE INVENTION

In one aspect, a quantum well device according to one or more embodiments may comprise: a first layer of a first two-dimensional material; a second layer of a second two-dimensional material; and a third layer of a third two-dimensional material disposed between the first layer and second layer, wherein the first layer, the second layer, and the third layer may be adhered predominantly by van der Waals force.

In one aspect, a method of manufacturing a quantum well device according to one or more embodiments may comprise: depositing, on a substrate, a first layer of a first two-dimensional material so that the substrate and the first layer are adhered predominantly by van der Waals force; depositing, on the first layer, a second layer of a second two-dimensional material so that the first layer and the second layer are adhered predominantly by van der Waals force; depositing, on the second layer, a third layer of a third two-dimensional material so that the second layer and the third layer are adhered predominantly by van der Waals force; depositing, on the third layer, a first contact; exposing the first layer; and depositing, on the first layer, a second contact.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

Embodiments of the invention include quantum well devices formed by layering two-dimensional semiconductor materials. The two-dimensional materials may have a flat atomic arrangement consisting of a single layer, as opposed to a three-dimensional crystalline pattern held together by covalent or ionic bonds. Graphene is one example of such a two-dimensional material. The inventor of the present invention found that quantum well devices realized by layering such two-dimensional materials exhibit certain desirable electrical and optical properties.

In one or more embodiments of the invention, the two-dimensional material is a layer that does not form chemical bonds with itself beyond two surfaces that are separated by a small distance from one another. In one or more embodiments of the invention, the two-dimensional material layer adheres to other two dimensional material layers predominantly by van der Waals force as opposed to other methods of adhesion such as ionic bonding, covalent bonding, or metallic bonding. In one or more embodiments, the bandgap of such two-dimensional materials may be adjustable, e.g., from below 0.5 eV to above 1.5 eV. Examples of such two-dimensional materials according to one or more embodiments are described below with reference to FIGS. 1-4.

Figure 1:
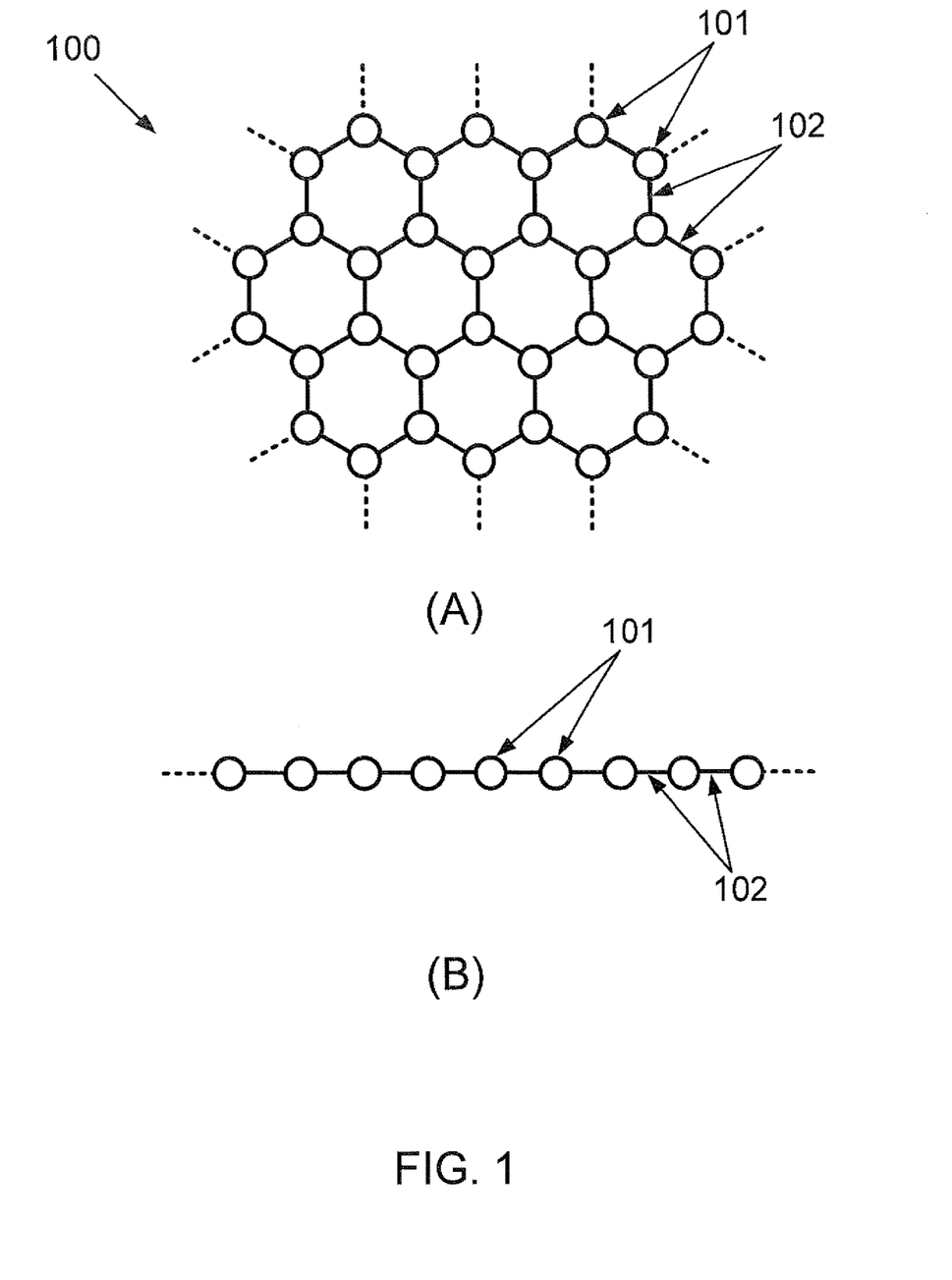
FIG. 1A shows a top view diagram of a two-dimensional material in accordance with one or more embodiments.
FIG. 1B shows a side view diagram of the two-dimensional material of FIG. 1A.

FIG. 1 shows a diagram of a two-dimensional material (100) according to one or more embodiments of the invention. Specifically, FIG. 1A shows a top view diagram of the two-dimensional material (100) and FIG. 1B shows a side view diagram of the two-dimensional material (100). The two-dimensional material (100) includes atoms of a material (101) and chemical bonds (102). As seen from FIG. 1B, all of the chemical bonds (102) are aligned along a single plane and no chemical bonds occur above or below the single plane. In one or more embodiments of the invention, the two-dimensional material may be silicene or black phosphorus.

Figure 2:
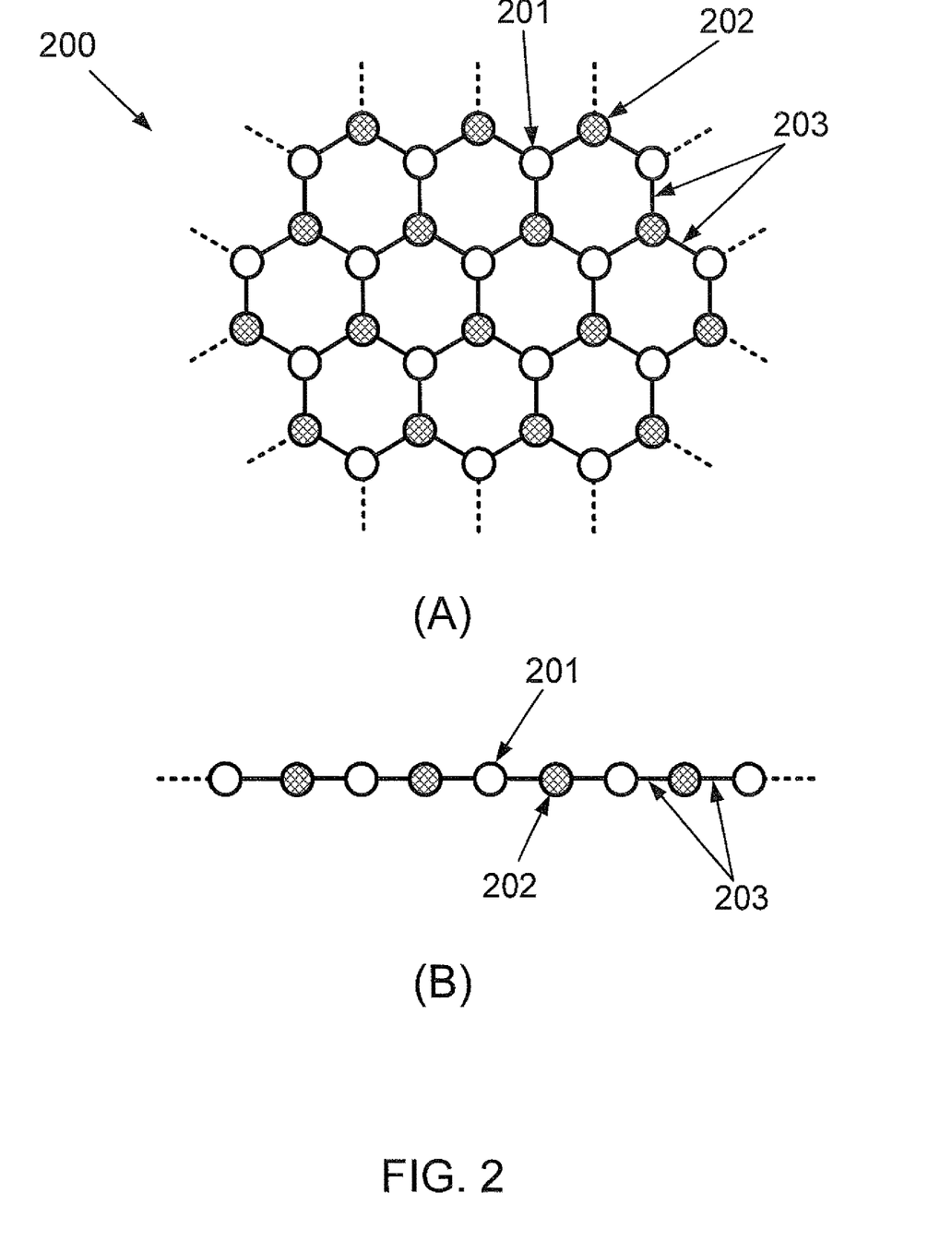
FIG. 2A shows a top view diagram of a second two-dimensional material in accordance with one or more embodiments.
FIG. 2B shows a side view diagram of the second two-dimensional material of FIG. 2A.

FIG. 2 shows a diagram of a two-dimensional material (200) according to one or more embodiments of the invention. Specifically, FIG. 2A shows a top view diagram of the two-dimensional material (200) and FIG. 2B shows a side view diagram of the two-dimensional material (200). The two-dimensional material (200) includes atoms of a first material (201) and atoms of a second material (202) held together by chemical bonds (203). As seen from FIG. 2B, all of the chemical bonds (202) are aligned along a single plane and no chemical bonds occur above or below the single plane. In one or more embodiments of the invention, the two-dimensional material (200) may be hexagonal boron nitride.

Figure 3:
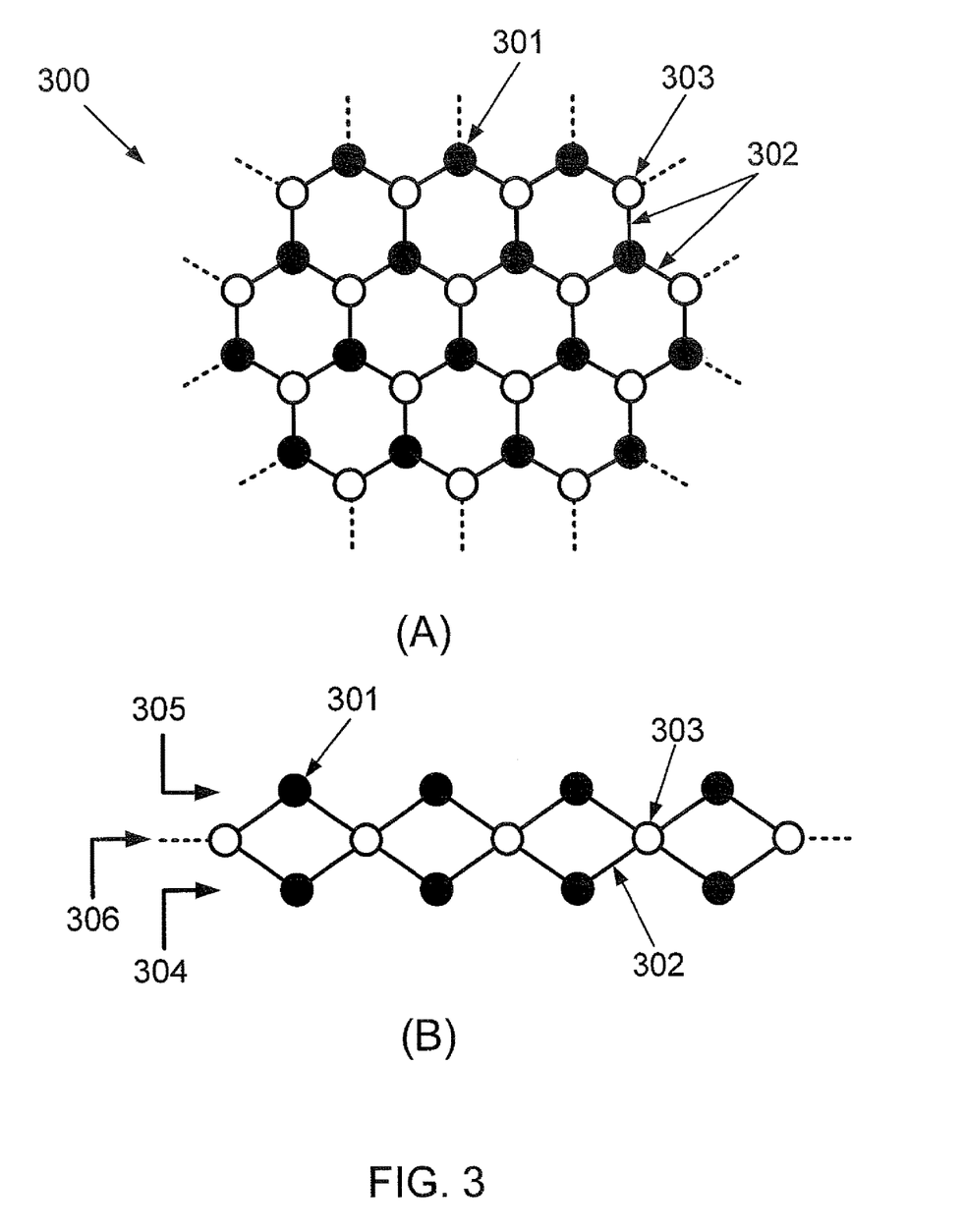
FIG. 3A shows a top view diagram of a third two-dimensional material in accordance with one or more embodiments.
FIG. 3B shows a side view diagram of the third two-dimensional material of FIG. 3A.

FIG. 3 shows a two-dimensional material (300) according to one or more embodiments of the invention. Specifically, FIG. 3A shows a top view diagram of the two-dimensional material (300) and FIG. 3B shows a side view diagram of the two-dimensional material (300). The two-dimensional material (300) includes atoms of a first material (301) and atoms of a second material (303) held together by chemical bonds (302). As seen in FIG. 3B, the two-dimensional material (300) includes three sub-layers (304)-(306) that are chemically bonded. The first sub-layer (304) and the second sub-layer (305) consist of atoms of the first material (301), while the third sub-layer (306) consists of atoms of the second material (303). The first sub-layer (304) is chemically bonded to the third sub-layer (306) and the second sub-layer (305) is also chemically bonded to the third sub-layer (306). No chemical bonds extend below the first sub-layer (304) or above the second sub-layer (305).

Referring still to FIG. 3, in one or more embodiments of the invention, the two-dimensional material (300) may be a chalcogenide. Alternatively, in one or more embodiments of the invention, the two-dimensional material (300) may be molybdenum disulfide, tungsten sulfide, molybdenum diselenide, or tungsten diselenide. Alternatively, in one or more embodiments of the invention, the two-dimensional material (300) may be molybdenum telluride, tungsten telluride, zirconium telluride, or zirconium diselenide. Alternatively, in one or more embodiments of the invention, the two-dimensional material (300) may be niobium diselenide, niobium disulfide, tantalum sulfide, titanium sulfide, or nickel sulfide. Alternatively, in one or more embodiments of the invention, the two-dimensional material (300) may be gallium selenide, gallium telluride, indium selenide, or bismuth selenide.

Figure 4:
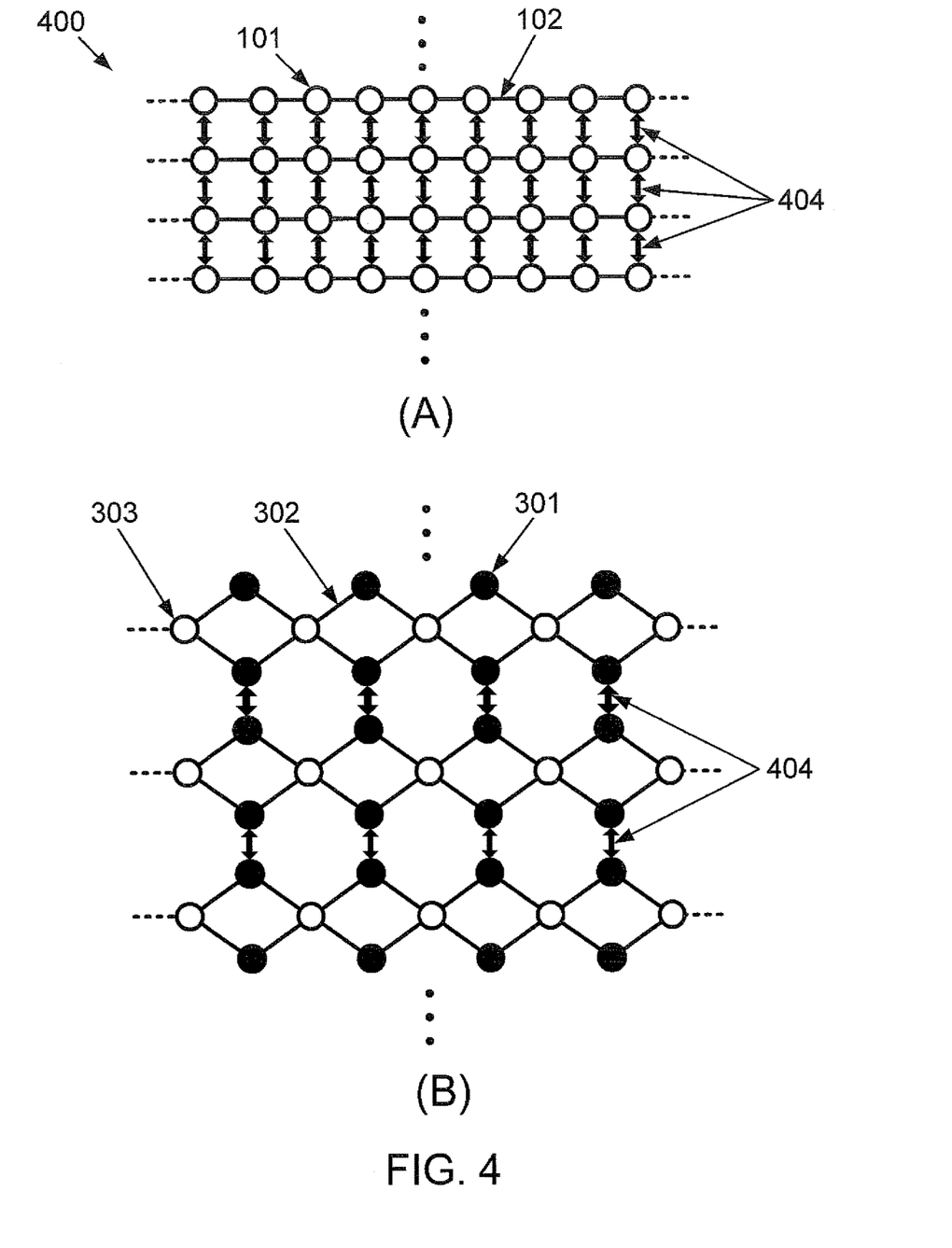
FIG. 4A shows a side view diagram of the forces between layers of the two-dimensional material of FIG. 1A in accordance with one or more embodiments.
FIG. 4B shows a side view diagram of the forces between layers of the two-dimensional material of FIG. 3A in accordance with one or more embodiments.

FIG. 4 shows a diagram of layered two-dimensional materials (400) according to one or more embodiments of the invention. Specifically, FIG. 4A shows a side view diagram of one two-dimensional material, e.g., the two-dimensional material (100), and FIG. 4B shows a side view diagram of another two-dimensional material, e.g., the two-dimensional material (300). As seen in FIG. 4A, when multiple layers of the two-dimensional material (100) are disposed on top of one another, the layers are predominantly held in place by van der Waals force (404), as indicated by the solid black, double sided arrows. Any two-dimensional material may be layered on top of any other two-dimensional material, without introducing defects, if the two-dimensional material layers are predominantly held in place by van der Waals force (404). Although not shown, the behavior of different two-dimensional materials may be identical to one another when layered.

As seen in FIG. 4B, when multiple layers of the two-dimensional material (300) are disposed on top of one another, the layers are predominantly held in place by van der Waals force (404), just like the other two-dimensional materials described above. Any two-dimensional material may be layered on top of any other two-dimensional material, without introducing defects, if the two-dimensional material layers are predominantly held in place by van der Waals force (404).

Figure 5:
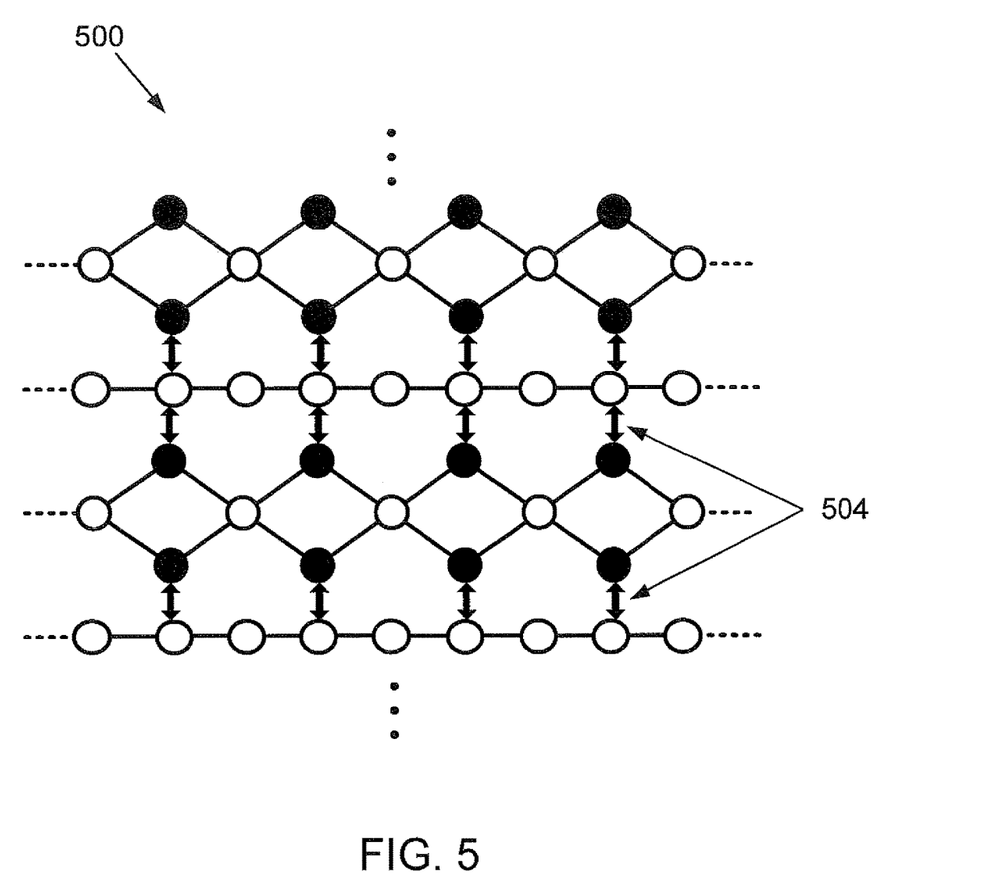
FIG. 5 shows a layered two-dimensional material in accordance with one or more embodiments.

Next, FIG. 5 shows a diagram of a heterogeneous layering of two-dimensional materials (500) according to one or more embodiments of the invention. As seen in FIG. 5, when multiple layers of the two-dimensional materials are interlayered in accordance with one or more embodiments, the layers are predominantly held in place by van der Waals force (504) between each layer.

Figure 6:
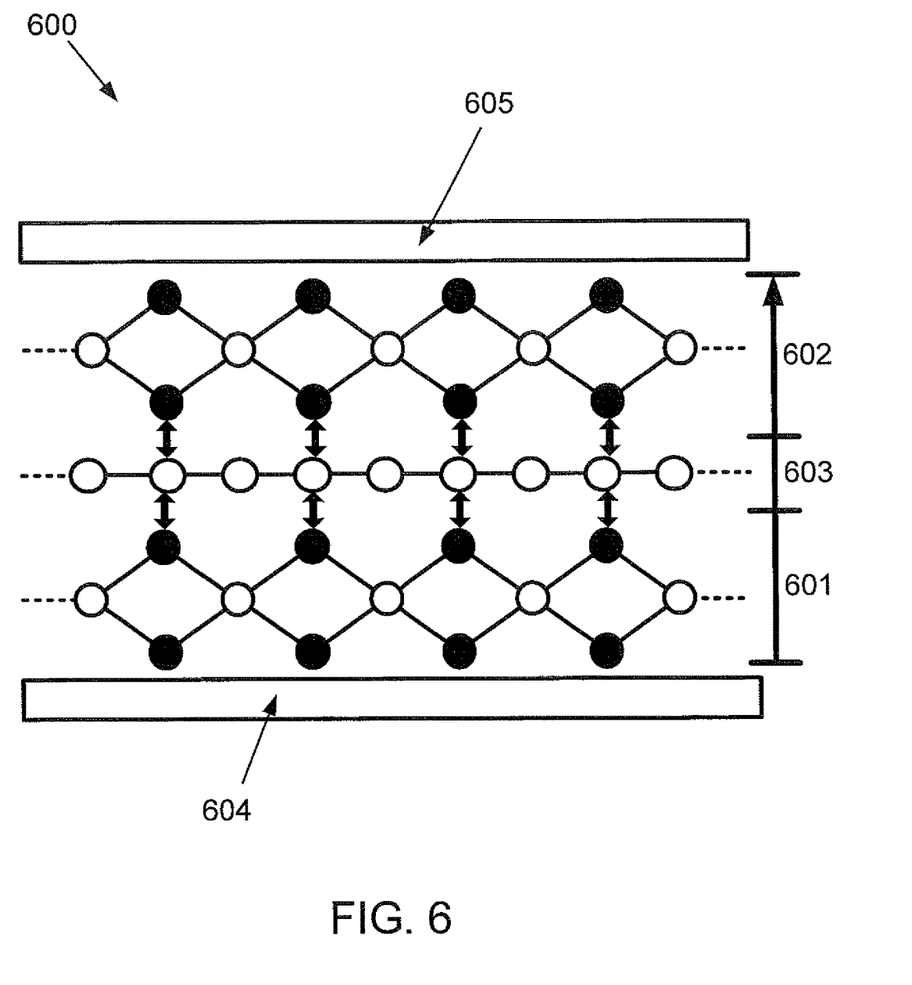
FIG. 6 shows a quantum well device in accordance with one or more embodiments.

According to one or more embodiments, a quantum well device can be made using two-dimensional materials such as those described above with reference to FIGS. 1-4. For example, FIG. 6 shows a quantum well device (600) according to one or more embodiments of the invention. The quantum well device (600) includes a first layer (601) of a first two-dimensional material, a second layer (602) of a second two-dimensional material, and a third layer (603) of a third two-dimensional material sandwiched between the first layer (601) and second layer (602). In one or more embodiments, the first two-dimensional material and the second two-dimensional material may be the same. The first layer (601) and second layer (602) are disposed on opposite sides of the third layer (603). The three layers are held in place by van der Waals force as indicated by the solid black, double sided arrows.

In one or more embodiments of the invention, the first two-dimensional material and the second two-dimensional material may both be molybdenum disulfide. In one or more embodiments of the invention, the material of the third layer may be hexagonal boron nitride or black phosphorus. In one or more embodiments of the invention, the first layer (601) may be molybdenum disulfide that is doped as an n-type semiconductor, e.g., to supply electrons. In one or more embodiments of the invention, the second layer (602) may be molybdenum disulfide that is doped as a p-type semiconductor, e.g., to supply holes.

Referring still to FIG. 6, in one or more embodiments of the invention, the quantum well device (600) further includes a first contact (604) disposed on the first layer (601) and a second contact (605) disposed on the second layer (602). The first contact (604) and second contact (605) may receive electrical power from an external source (not shown). In one or more embodiments of the invention, the first contact (604) and second contact (605) may be metal. In one or more embodiments of the invention, the first contact (604) and second contact (605) may be copper, nickel, or aluminum. In one or more embodiments of the invention, the first contact (604) and second contact (605) may be indium tin oxide.

Figure 7:
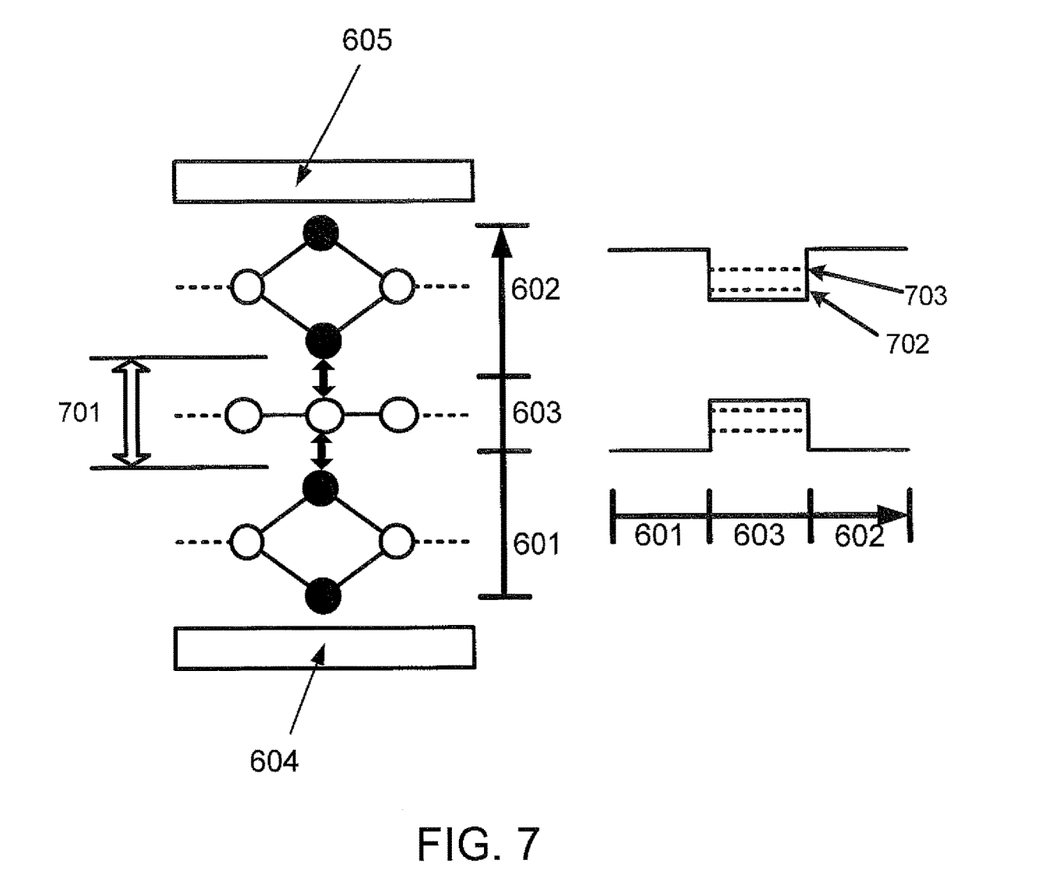
FIG. 7 shows another quantum well device in accordance with one or more embodiments.

FIG. 7 shows a section of a quantum well device (600) and an energy band diagram for the quantum well device (600) according to one or more embodiments of the invention. As indicated by the energy band diagram, a bandgap exists at the interface of the first layer (601) and third layer (603) and the interface of the second layer (602) and third layer (603). The two bandgaps create a quantum well with quantized allowed energy levels, and may be adjusted to achieve desired wavelengths. The thickness (701) of the third layer (603) determines the magnitude of the quantized allowed energy levels, such as the first allowed energy level (702), second allowed energy level (703), and all higher energy levels.

Figure 8:
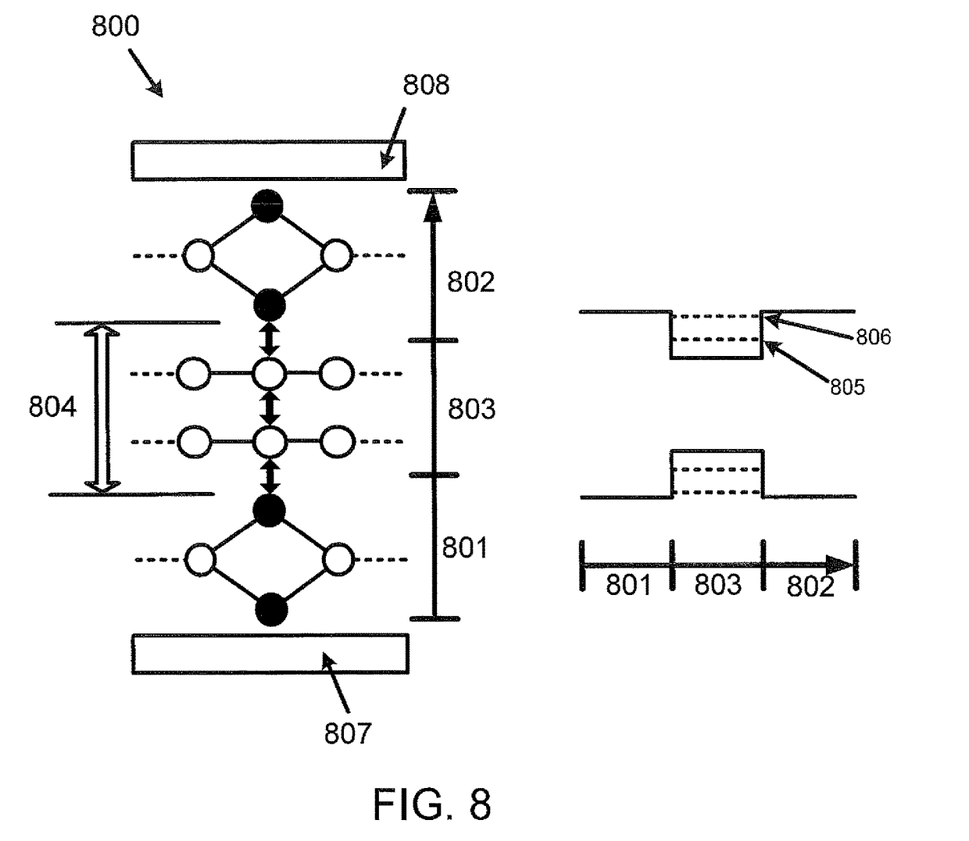
FIG. 8 shows another quantum well device in accordance with one or more embodiments.

FIG. 8 shows a quantum well device (800) and an energy band diagram for the quantum well device (800) according to one or more embodiments of the invention. The quantum well device (800) includes a first layer (801) of a first two-dimensional material, a second layer (802) of a second two-dimensional material, and a third layer (803) of a third two-dimensional material. In one or more embodiments, the first two-dimensional material and the second two-dimensional material may be the same. The third layer (803) includes two sub-layers of the third two-dimensional material. The first layer (801) and second layer (802) are disposed on opposite sides of the third layer (803). The three layers are predominantly held in place by van der Waals force as indicated by the solid black, double sided arrows.

In one or more embodiments of the invention, the first two-dimensional material and the second two-dimensional material may both be molybdenum disulfide. In one or more embodiments of the invention, the third two-dimensional material may be hexagonal boron nitride or black phosphorus. In one or more embodiments of the invention, the first layer (801) may be molybdenum disulfide that is doped as an n-type semiconductor, e.g., to supply electrons. In one or more embodiments of the invention, the second layer (802) may be molybdenum disulfide that is doped as a p-type semiconductor, e.g., to supply holes.

As indicated by the energy band diagram in FIG. 8, a bandgap exists at the interface of the first layer (801) and third layer (803) and the interface of the second layer (802) and third layer (803). The two bandgaps create a quantum well with quantized allowed energy levels. The thickness (804) of the third layer (803) determines the magnitude of the quantized allowed energy levels, such as the first allowed energy level (805), second allowed energy level (806), and all higher energy levels. The thickness (804) of the third layer (803) has been doubled from the thickness (701) of the third layer (604) of the quantum well device (600) shown in FIG. 7. Modifying the thickness (803) of the third layer (803) increases the first energy level (805) of the quantum well device (800) when compared to the first energy level (702) of the quantum well device (600) shown in FIG. 7.

In one or more embodiments of the invention, the quantum well device (800) further includes a first contact (807) disposed on the first layer (801) and a second contact (808) disposed on the second layer (802). The first contact (807) and second contact (808) receive electrical power from an external source (not shown). In one or more embodiments of the invention, the first contact (807) and second contact (808) may be metal. In one or more embodiments of the invention, the first contact (807) and second contact (808) may be copper, nickel, or aluminum. In one or more embodiments of the invention, the first contact (807) and second contact (808) may be indium tin oxide.

In one or more embodiments of the invention, the quantum well device of FIG. 7 or 8 may be part of a photon detector. For example, a bias voltage may be applied between the first contact and the second contact. The applied voltage shifts the allowed energy levels, e.g., a first allowed energy level (805), a first allowed energy level (702), a second allowed energy level (806), etc. When an allowed energy level is shifted to align with the conduction band, photons with the allowed energy level that has been aligned to the conduction band are efficiently absorbed by the third layer, e.g., third layer (803) or third layer (603). When a photon is absorbed, electrons are excited from the ground state to the higher state, causing a high photo current to flow between the first contact and second contact.

In one or more embodiments of the invention, the quantum well device of FIG. 7 or 8 may be part of a light emitting diode or laser. For example, a driving voltage is applied between the first contact and the second contact. Electrons from the first layer, e.g., first layer (601) or first layer (801), are driven into the third layer, e.g., third layer (603) or third layer (803). Holes from the second layer, e.g., second layer (602) or second layer (802) are driven in the third layer. Within the third layer, pairs of electrons and hole recombine and release a photon.

Figure 9:
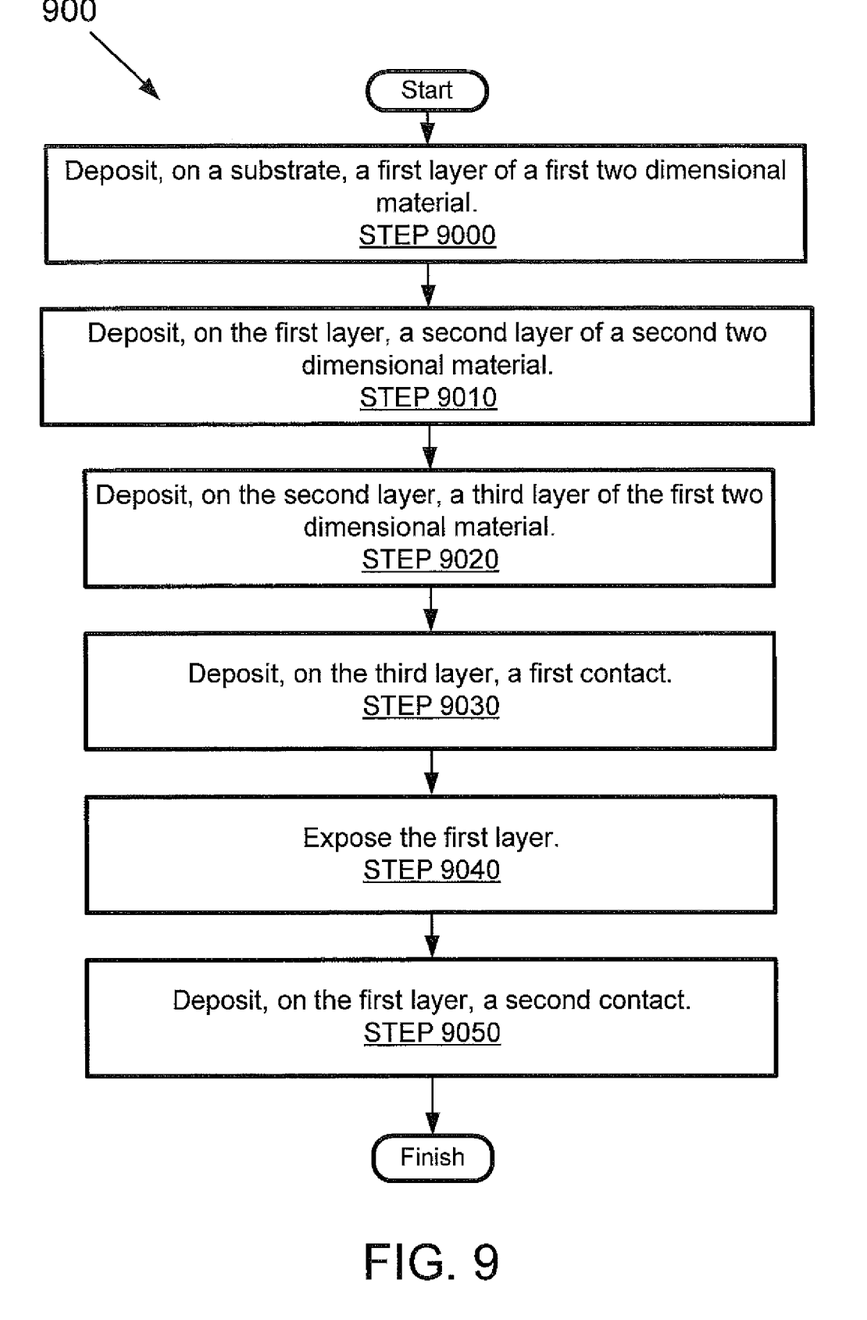
FIG. 9 shows a method to manufacture a quantum well device in accordance with one or more embodiments.

FIG. 9 shows a flowchart (900) according to one or more embodiments of the invention. The method depicted in FIG. 9 may be used to produce a quantum well device in accordance with one or more embodiments of the invention. One or more steps shown in FIG. 9 may be omitted, repeated, and/or performed in a different order among different embodiments.

At Step 9000, a first layer of a first two-dimensional material is deposited onto a substrate. For example, the first layer may be deposited by Mechanical Exfoliation (ME) of a layer of a first two-dimensional material from a slab comprising a plurality of layers of a two-dimensional material by adhesive backed tape and stacking the layers on the substrate. As another example, the first layer may be deposited by Chemical Vapor Deposition (CVD) using thermal and/or plasma energies to break down precursors that form two-dimensional materials by a gas phase chemical reaction process. As another example, the first layer may be deposited by Atomic Layer Deposition (ALD) using thermal and/or plasma energies to break down precursors that form two-dimensional materials by sequential use of a gas phase chemical reaction.

At Step 9010, a second layer of a second two-dimensional material is deposited on the first layer. In one or more embodiments of the invention, the second layer may be deposited by ME, CVD, or ALD. In one or more embodiment of the invention, depositing the second layer on the first layer by ME, CVD, or ALD adheres the first layer and second layer predominantly by van der Waals force. At Step 9020, a third layer of a third two-dimensional material is deposited on the second layer. In one or more embodiments of the invention, the third layer may be deposited by ME, CVD, or ALD. In one or more embodiment of the invention, depositing the third layer on the second layer by ME, CVD, or ALD adheres the second layer and third layer predominantly by van der Waals force. In one or more embodiments, the first two-dimensional material and the third two-dimensional material may be the same. At Step 9030, a first metal contact is deposited on the third layer. In one or more embodiments of the invention, the metal contact may be deposited by Metal Vapor Deposition (MVD) or CVD. At Step 9040, the first layer is exposed. In one or more embodiments of the invention, the first layer is exposed by removing the substrate. In one or more embodiments of the invention, the first layer is exposed by removing a portion of the substrate. In one or more embodiments, the first layer is exposed by removing a portion of the second layer and the third layer. At Step 9050, a second metal contact is deposited on the first layer. In one or more embodiments of the invention, the metal contact may be deposited by Metal Vapor Deposition (MVD) or CVD.

A quantum well device according to one or more embodiments of the invention may provide one or more of the following advantages. A quantum well device according to one or more embodiments provides a two-dimensional atomic device that need not rely on conventional epitaxial crystal growth techniques. Therefore, the quantum well device according to one or more embodiments may be simpler in design compared to conventional quantum well devices. Further, a quantum well device according to one or more embodiments may be fabricated at lower temperature and with various substrates including polymer. A typical polymer substrate material, such as PET and PEN, degrade at around 150° C. which is much lower than the required temperature to form high quality conventional semiconductor crystalline materials formed by strong chemical bonding. A quantum well device according to one or more embodiments may also provide defect-free interface for carriers due to the van de Waals bonding effect, which provides high-speed carrier mobility suitable for, e.g., high-speed electron devices. This feature may also provide improved efficiency in photoemitters or photodetectors. Further, a quantum well device according to one or more embodiments may provide tunable bandgaps and multiple wavelengths. A desired wavelength may also be achieved with strong photo emission. Further, a quantum well device according to one or more embodiments may provide added flexibly in achieving photon energy selectivity for emission and detection by, e.g., adjusting bandgaps of the well or controlling a number of two-dimensional layered well materials or doping of the well. A quantum well device according to one or more embodiments can also have multiple quantum wells comprising multiple two-dimensional material layers stacked together, which may achieve higher gains or sensitivity. A quantum well device according to one or more embodiments may be used in various electronic, optical, or optoelectronic devices for improved performance.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A quantum well device, comprising:
a quantum well that comprises:
   a first layer of a first two-dimensional material;
   a second layer of a second two-dimensional material;
   a third layer of a third two-dimensional material disposed between the first layer and second layer;
   a first metal contact; and
   a second metal contact,
   wherein the first layer, the second layer, and the third layer are adhered predominantly by van der Waals force,
   wherein a bias voltage, applied between the first metal contact and the second metal contact across a thickness of the third layer, shifts a quantized allowed energy level of the third layer to align with a conduction band of the third layer to:
      absorb photons of a predetermined energy level, and
      generate a photocurrent between the first metal contact and the second metal contact.

2. The quantum well device according to claim 1, wherein the first two-dimensional material is doped to be an n-type semiconductor.

3. The quantum well device according to claim 1, wherein the second two-dimensional material is doped to be a p-type semiconductor.

4. The quantum well device according to claim 1, wherein the third layer comprises a plurality of sub-layers of the third two-dimensional material, and each of the sub-layers of the plurality of sub-layers is adhered predominantly by van der Walls force.

5. The quantum well device according to claim 4, wherein a bandgap of the third layer is smaller than a bandgap of the first and the second layers and is adjustable by varying a number of the sub-layers of the third layer.

6. A multi-well quantum well device, comprising at least one quantum well device according to claim 1.

* * * * *